(12) United States Patent
Sim

(10) Patent No.: US 7,249,298 B2
(45) Date of Patent: Jul. 24, 2007

(54) MULTIPLE SCAN CHAINS WITH PIN SHARING

(75) Inventor: Gyoochan Sim, Kyunggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 690 days.

(21) Appl. No.: 10/136,670

(22) Filed: Apr. 30, 2002

(65) Prior Publication Data
US 2003/0204802 A1    Oct. 30, 2003

(51) Int. Cl.
G01R 31/28    (2006.01)

(52) U.S. Cl. .................. 714/726; 714/727; 714/814

(58) Field of Classification Search ............... 714/726, 714/727, 728, 729, 30, 814; 324/765; 375/327, 375/376; 371/22.31
See application file for complete search history.

(56) References Cited

U.S. PATENT DOCUMENTS

| | | | |
|---|---|---|---|
| 4,701,921 A | 10/1987 | Powell et al. | |
| 4,730,316 A | 3/1988 | Desyllas et al. | |
| 4,947,357 A * | 8/1990 | Stewart et al. ............. | 714/726 |
| 5,592,493 A | 1/1997 | Crouch et al. | |
| 5,909,451 A * | 6/1999 | Lach et al. ................ | 714/726 |
| 6,070,260 A | 5/2000 | Buch et al. | |
| 6,275,057 B1 * | 8/2001 | Takizawa ................... | 324/765 |
| 6,418,545 B1 * | 7/2002 | Adusumilli ................ | 714/729 |
| 6,516,432 B1 * | 2/2003 | Motika et al. ............. | 714/732 |
| 6,591,388 B1 * | 7/2003 | Vonreyn .................... | 714/726 |
| 6,691,268 B1 * | 2/2004 | Chin .......................... | 714/726 |
| 6,766,487 B2 * | 7/2004 | Saxena et al. ............. | 714/726 |
| 6,877,119 B2 * | 4/2005 | Lauga ........................ | 714/726 |
| 2001/0011361 A1 | 8/2001 | Park et al. | |

FOREIGN PATENT DOCUMENTS

EP     0639006    2/1995

OTHER PUBLICATIONS

Patrick P. Fasang et al. "Automated Design for Testability of Semiconductor Integrated Circuits" *Proc. Of Int'l Test Conf.*, pp. 558-564, Nov. 1985.

Thomas M. Niemann, et al. "Test Compaction for Sequential Circuits" *IEEE Transaction On Computer-Aided Design*, vol. 11, No. 2, Feb. 1992, pp. 260-267.

(Continued)

*Primary Examiner*—Guy Lamarre
*Assistant Examiner*—Fritz Alphonse
(74) *Attorney, Agent, or Firm*—Marger Johnson & McCollom, P.C.

(57) ABSTRACT

A scan based design architecture reduces pin count, test time and power consumption, and also allows the use of existing verified scan vectors by driving multiple scan chains from one scan input and utilizing multiple scan clocks. The scan vectors for multiple scan chains are sequentially applied to the scan input so as to broadcast the vectors to multiple scan chains, but only the bits for one scan chain are selectively clocked into that chain by a corresponding one of the multiple scan clocks. An output multiplexer can also be used to reduce the total number of test pins. The pin count can be further reduced by using a scan clock generator to generate the multiple scan clocks from a single scan clock input, and by using a select signal generator to generate select signals that control an output multiplexer.

37 Claims, 14 Drawing Sheets

OTHER PUBLICATIONS

Irith Pomeranz, et al. "COMPACTEST: A Method to Generate Compact Test Sets for Combinational Circuits" *Proc. of Int'l Test Conf.*, Oct. 1991 pp. 194-203.

Soo Young Lee, et al. "Test Application Time Reduction for Sequential Circuits with Scan" *IEEE Transaction On Computer-Aided Design of Integrated Circuit and Systems*. vol. 14. No. 9 Sep. 1995, pp. 1128-1140.

Yoshinobu Higami, et al "Test Sequence Compaction by Reduced Scan Shift and Retiming" *Proc. Asia Test Symp.*, pp. 169-175, Nov. 1995.

J.S. Chang, et al. "Test Time Reduction for Scan-Designed Circuits by Sliding Compatibility" *IEE Proc. Computers and Digital Techniques*, vol. 142, No. 1, pp. 41-48 Jan. 1995.

Rajesh Gupta, et al. "Ordering Storage Elements in a Single Scan Chain" *Proc. Int'l Conf. On Computer-Aided Design*, pp. 408-411, Nov. 1991.

Sridhar Narayanan, et al. "Optimal Configuring of Multiple Scan Chains" *IEEE Transaction on computer*, vol. 42, No. 9, Sep. 1993, pp. 1121-1131.

Sean P. Morley, et al. "Selectable Length Partial Scan: A Method to Reduce Vector Length" *Proc. Int'l Test Conf.*, pp. 385-392, Nov. 1991.

Sridhar Narayanan, "Reconfiguration Techniques for Single Scan Chain" *IEEE Trans. On Computer-Aided Design*, vol. 14, No. 6, pp. 750-765, Jun. 1995.

Hideo Fujiwara, et al. "Parity-Scan Design to Reduce the Cost of Test Application" *Proc. Int'l Test Conf.*, pp. 283-292, Sep. 1992.

Kuen Jong Lee, et al. "Using a Single Input to Support Multiple Scan Chains" *Proc. Int'l Conf. On Computer-Aided Design*, pp. 74-78, Nov. 1998.

Jin et al. "Dynamic Power Estimation Using the Probabilistic Contribution Measure (PCM)," *Proc., Int'l Symp. On Low Power Electronics and Design*, pp. 279-281, Aug. 1999.

Patrick P. Fasang, et al. "Automated Design for Testability of Semicustom Integrated Circuits" *Proc., International Test Conference*, IEEE, Oct. 1985, pp. 558-564.

Abhijit Jas, et al. "Test Vector Decompression via Cyclical Scan Chains and Its Application to Testing Core-Based Designs" *Proc., International Test Conference*, IEEE, Oct. 1998, 7 pages.

Joep Aerts, et al. "Scan Chain Design for Test Time Reduction in Core-Based ICs" *Proc., International Test Conference*, IEEE Oct. 1998, pp. 448.

Elizabeth M. Rudnick, et al. "A Genetic Approach to Test Application Time Reduction for Full Scan Partial Scan Circuits" $8^{th}$ *International Conference on VLSI Design.*, IEEE, Jan. 1995 pp. 288-293.

Sandeep Bhatia, et al. "Test Compaction in a Parallel Access Scan Environment" *Proc., Sixth Asian Test Symposium, 1997 (ATS '97)*, pp. 300-305.

Sridhar, et al. "Configuring Multiple Scan Chains for Minimum Test Time" *ACM International Conference on Computer-Aided Design, 1992. ICCAD-92. Digest of Technical Papers*, Nov. 1992, pp. 4-8.

Sridhar Narayanan, et al. "Asynchronous Multiple Scan Chains" *Proc., $13^{th}$ IEEE VLSI Test Symposium*, 1995, pp. 276-276.

P. Girard, "Low Power Testing of VLSI Circuits: Problems and Solutions," *Proc., Int'l Symp. On Quality Electronic Design*, Mar. 2000, pp. 173-178.

\* cited by examiner

| S2 | S1 | Y |
|----|----|----|
| 0 | 0 | D1 |
| 0 | 1 | D2 |
| 1 | 0 | D3 |
| 1 | 1 | D4 |

FIG. 17

|  | 1 scan chain configuration | 2 scan chain configuration | 4 scan chain configuration |
|---|---|---|---|
| No. of mismatch | 0 | 0 | 0 |
| Simulation time (ns) | 73,159,700 | 35,319,900 | 17,763,900 |
| CPU time (sec) | 36,500 | 19,837 | 8,422 |

FIG. 18

|  | 1 scan chain configuration | | 2 scan chain configuration | | 4 scan chain configuration | |
|---|---|---|---|---|---|---|
|  | Total number | Total % | Total number | Total % | Total number | Total % |
| Untestable | 3,724 |  | 3,726 |  | 3,728 |  |
| Drop_detected | 103,368 | 90.2 | 102,821 | 90.4 | 101,936 | 90.1 |
| Detected | 0 | 0 | 0 | 0 | 0 | 0 |
| Potential | 0 | 0 | 0 | 0 | 0 | 0 |
| Undetected | 4,479 | 3.9 | 5,111 | 4.5 | 5,225 | 4.6 |
| Drop_potential | 6,731 | 5.9 | 5,772 | 5.1 | 6,003 | 5.3 |
| Total | 114,578 |  | 113,704 |  | 113,164 |  |

FIG. 19

|  | Maximum Current (mA) | | |
| --- | --- | --- | --- |
|  | 1 scan chain configuration | 2 scan chain configuration | 4 scan chain configuration |
| Original circuit | 1325.179 | 1512.314 | 1374.133 |
| Patent circuit | 1325.179 | 1006.92 | 655.773 |

MULTIPLE SCAN CHAINS WITH PIN SHARING

BACKGROUND

1. Field of the Invention

The present invention relates generally to techniques for testing circuits, and more particularly to methods and apparatus for testing with multiple scan chains using pin sharing.

2. Description of the Related Art

Scan based design is a circuit testing technique that involves converting memory/state elements into scan elements (also referred to as scan cells), and then connecting many of these scan elements into one or more serial shift registers (also referred to as scan chains) that wind through the circuit under test (CUT). Each scan chain typically begins at a scan input, traces forward through numerous scan elements, and terminates at a scan output. The scan architecture allows the circuit under test to be placed in a known data state by serially shifting test data patterns (also referred to as test vectors or scan vectors) into the scan chains through the scan inputs under the control of a scan clock. The operation of the circuit under test can then be observed by using the same scan chains to shift data out through the scan outputs.

Scan based design has become one of the most widely used design for test (DFT) techniques for testing complicated circuits such as those found on integrated circuits (ICs or "chips"). Scan based design enables the use of automatic test pattern generation (ATPG) techniques to create test vectors that provide efficient fault detection, and reduce the cost of testing ICs.

As integrated circuits become increasingly complex, however, reducing the time, and thus cost, of testing becomes more critical. With some very large scale integration (VLSI) products, e.g., system on chip (SOC), the recurring test cost can be 2, 3 and even 4 times the cost of fabricating the chip itself.

To reduce test application times, techniques involving the use of multiple scan chains have been developed. These techniques divide a single scan chain into multiple chains and allow shorter test vectors to be shifted into the circuit under test in parallel, thereby reducing the test time. Existing multiple scan chain techniques, however, require that additional valuable input/output terminals be dedicated to use as scan inputs/outputs.

Efforts to drive multiple scan chains from a single input have produced techniques that require complicated analysis of scan chain circuits and test vectors, including the recomposition of virtual circuits before ATPG can be utilized. This dramatically increases the testing overhead while only providing slight reduction in scan test time.

SUMMARY

One aspect of the present invention is a circuit comprising a plurality of scan chains having a plurality of scan inputs coupled to an input terminal, and a plurality of scan clock inputs coupled to receive a plurality of scan clock signals. Another aspect is a method for testing a circuit comprising a plurality of scan chains having a plurality of scan inputs and a plurality of scan outputs, the method comprising: driving the plurality of scan inputs through an input terminal; and clocking the plurality of scan chains with a plurality of scan clock signals.

A further aspect of the present invention is a circuit comprising a plurality of scan chains having a plurality of scan outputs coupled to an output terminal through a multiplexer. Another aspect is a method for testing a circuit comprising a plurality of scan chains having a plurality of scan inputs and a plurality of scan outputs, the method comprising shifting out data from the plurality of scan outputs through an output terminal.

Yet another aspect of the present invention is a method for loading scan vectors into a circuit comprising a plurality of scan chains having a plurality of scan inputs and a plurality of scan outputs, the method comprising: broadcasting a plurality of scan vectors to the plurality of scan chains; and selectively clocking only the bits of a first one of the scan vectors into a first one of the scan chains.

These and other aspects of the present invention are disclosed and claimed.

BRIEF DESCRIPTION OF THE DRAWINGS

FIG. 17 is a table showing experimental logic simulation times for some embodiments of scan chain architectures in accordance with the present invention.

FIG. 18 is a table showing experimental fault simulation statistics for some embodiments of scan chain architectures in accordance with the present invention.

FIG. 19 is a table showing experimental peak power consumption for some embodiments of scan chain architectures in accordance with the present invention.

DETAILED DESCRIPTION

Figure 1:
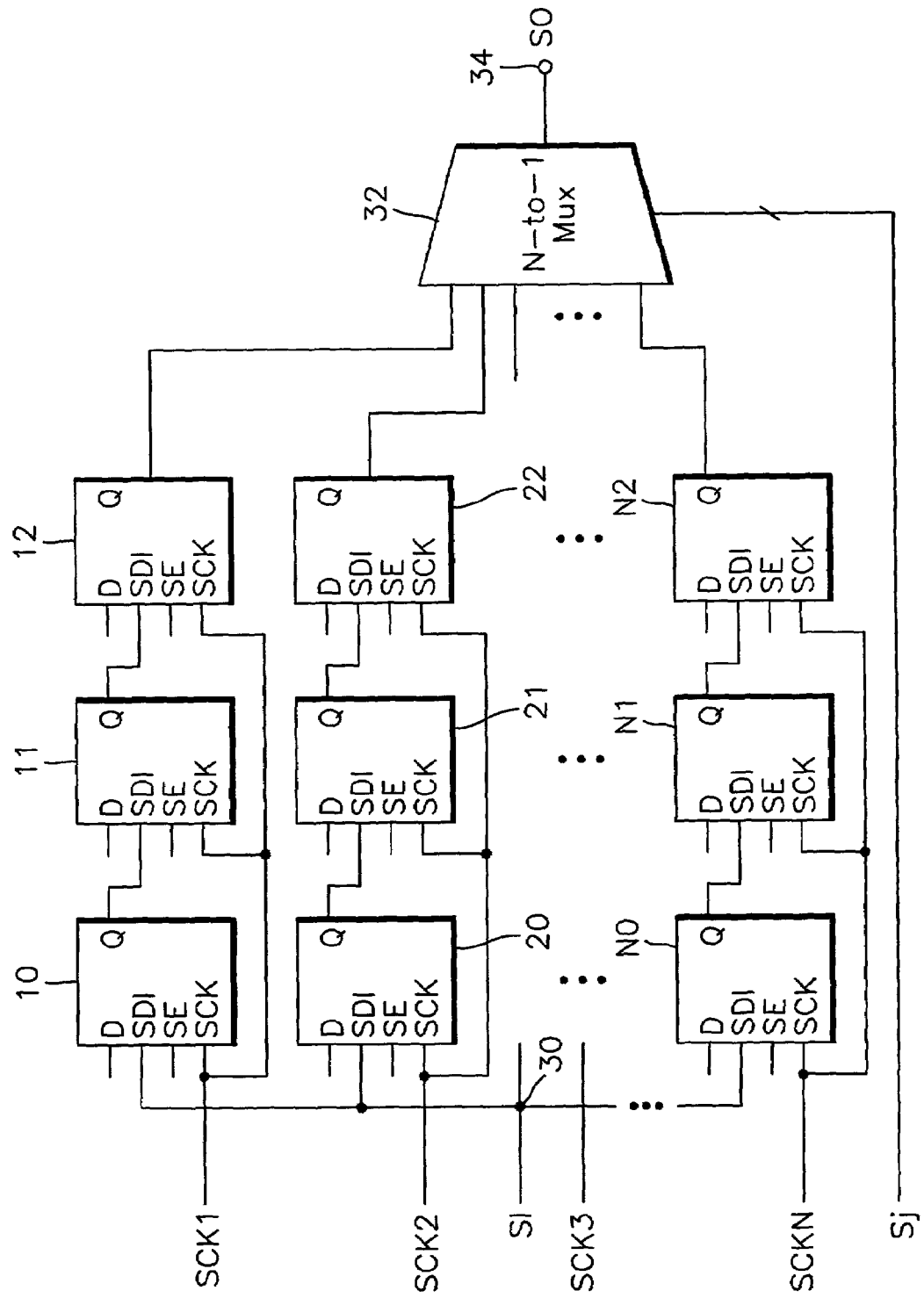
FIG. 1 is a schematic diagram of an example embodiment of a scan chain architecture in accordance with the present invention.

FIG. 1 is a schematic diagram of an example embodiment of a scan chain architecture in accordance with the present invention. The design of FIG. 1 includes "N" scan chains, the first scan chain being formed from scan cells 10, 11 and 12; the second scan chain being formed from scan cells 20, 21 and 22; and so forth, with the final scan chain being formed from scan cells N0, N1 and N2. For illustrative purposes, the scan cells shown in FIG. 1 are D type multiplexed scan flip-flops, each having a primary input D, a primary output Q, a scan input SDI, a scan enable SE, and a clock input which also functions as a scan clock input SCK.

The scan inputs SDI of the first cell of each chain are connected together at a single scan input terminal 30 so that the input to each chain receives the same scan input signal SI. The Q output of each cell is connected to the SDI input of the next successive cell in its respective chain. In this embodiment, the Q output of the final cell in each chain is connected to a corresponding input of an N-to-1 multiplexer 32. The output from multiplexer 32 provides the scan output signal SO at scan output terminal 34 under the control of select signals Sj (where "j" is a number from 1 to $\lceil Log_2N \rceil$, and where $\lceil X \rceil$ indicates the upper bound of X). The scan cells within each chain have their clock inputs SCK connected together to receive a corresponding scan clock signal SCKi (where "i" is a number from 1 to N) such that each scan chain has its own scan clock signal. Although not shown in FIG. 1, the scan enable inputs SE of the cells in all chains are connected to allow the cells to operate in all of their operational modes such as functional operation, scan load/unload, scan data apply, and scan sample.

A scan operation of the embodiment of FIG. 1 will now be described with reference to FIG. 2. After a scan enable signal SE (not shown) is activated to place the scan chains in scan mode, the first bit (SI1) of a scan vector for the first chain is applied to the SI input and clocked into the first scan cell 10 by a pulse on the first scan clock signal SCK1. The first bit of each of the vectors for the remaining chains (SI2 . . . SIN) are sequentially applied to the SI input and clocked in by pulses on corresponding clock signals SCK2 . . . SCKN. This sequence is repeated with the next bit of each vector being clocked into the corresponding scan chain until the complete vector for each chain is loaded. Thus, multiple scan vectors are broadcast to the inputs of multiple scan chains, but only the bits for one specific scan chain are being selectively clocked into that chain by a corresponding one of the scan clock signals.

A scan shift-out operation is performed by sequentially selecting a scan chain output using the multiplexer 32 in response to the select signals of FIG. 1, and shifting out the selected scan chain output via the scan output terminal 34.

Figure 2:
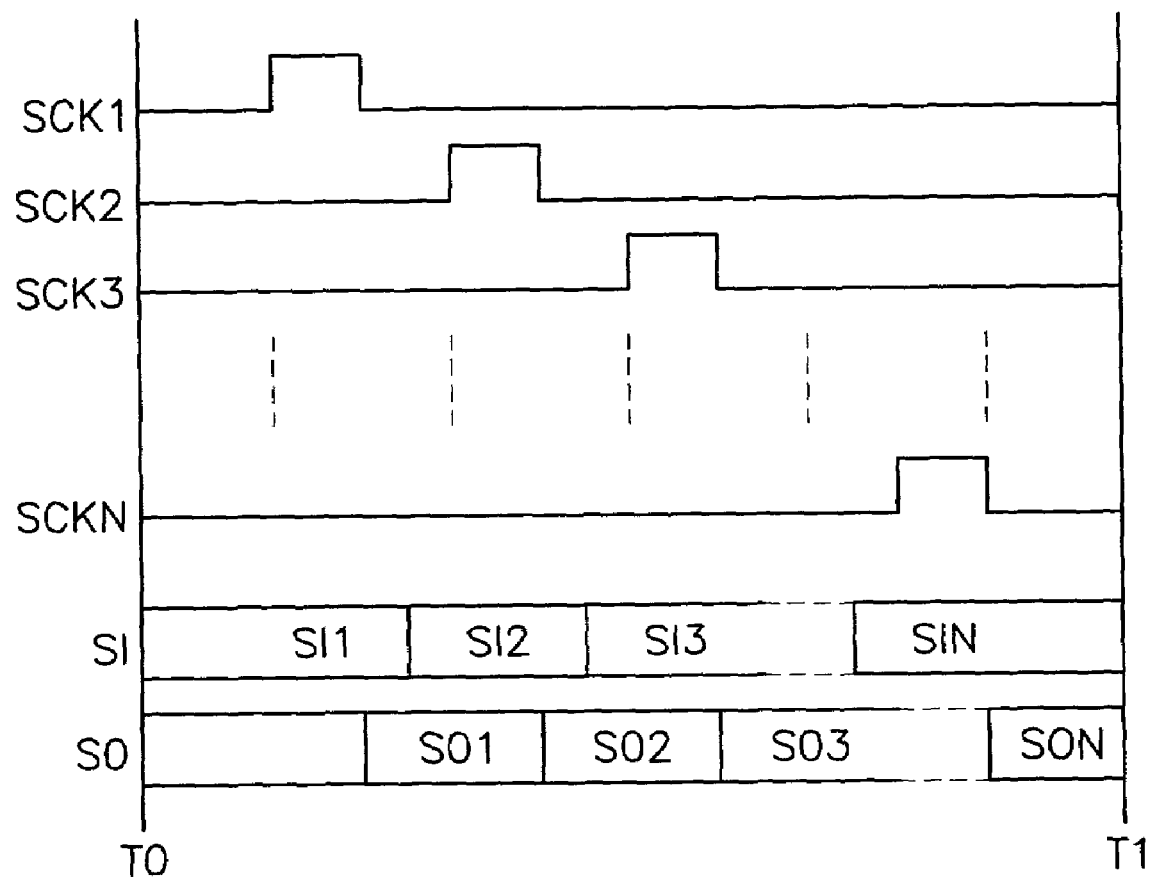
FIG. 2 is a timing diagram that illustrates the operation of the embodiment of FIG. 1.

The interval between times T0 and T1 in FIG. 2 is preferably equal to the cycle time for shifting in a single bit in a prior art scan chain design. That is, the test data SI1, SI2, SI3. . . SIN is provided to the SI input at a rate that is N times faster than in a system in which each scan chain has its own input. Thus, test data is shifted into the circuit under test at N times the speed of the prior art, but the clock signal SCKi for each individual scan chain operates at the same frequency it was originally designed for, so it is easy to adapt devices having existing multiple scan chains to work in accordance with the present invention.

The example embodiment shown in FIG. 1 can be modified in many ways, and the present invention is not limited to this embodiment. For example, the embodiment of FIG. 1 is implemented with the primary output Q of each scan cell connected to the scan input SDI of the next scan cell in the chain. However, in some embodiments, the scan cells might have separate scan outputs SDO each of which is connected to the SDI input of the next cell. Also, the multiplexer 32 could be omitted from the embodiment of FIG. 1, albeit at the expense of additional output terminals which would be needed to provide the scan outputs. As a further example, the scan chains could be made up of different types of scan cells, e.g., level sensitive scan design (LSSD) cells as described below.

If a scan chain includes cells made up of both positive and negative edge triggered flip-flops that are driven by the same scan clock, the negative edge triggered flip-flops should precede the positive edge triggered flip-flops if the clock signal is an active high signal as shown in FIG. 2. Also, the active edges of the various scan clock signals should not overlap (or in the case of level sensitive scan design (LSSD), the level should not overlap) since only one bit of test data can be on the scan input line at a time. The scan clock signals will typically have minimum pulse widths, and the time required for an output port to perform a strobe operation should be determined with consideration of the delay between the time when a scan clock is applied until the output data reaches the output port.

Figure 3:
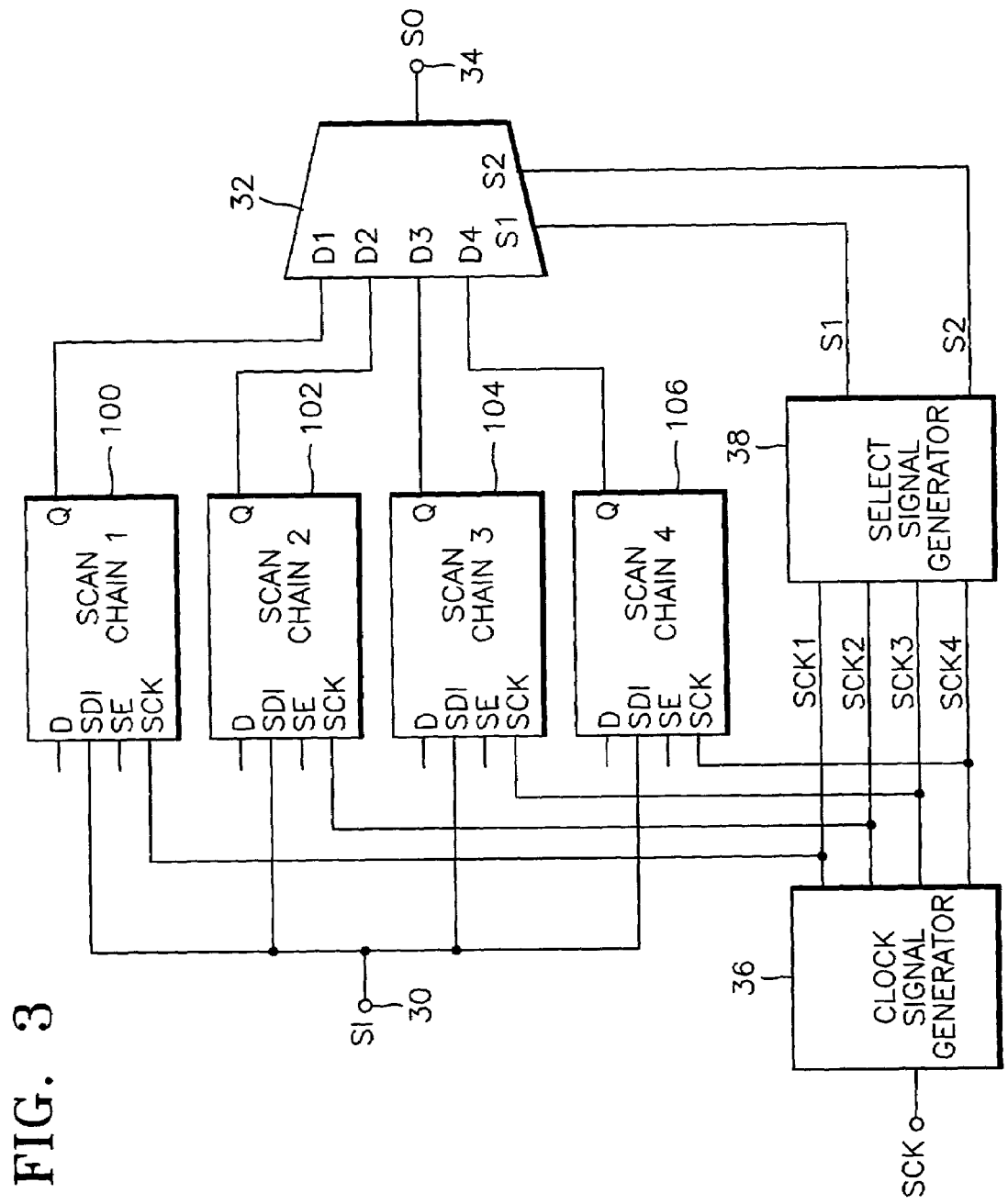
FIG. 3 is a schematic diagram of another example embodiment of a scan chain architecture in accordance with the present invention.

As described above, the embodiment of FIG. 1 reduces the number of input terminals required to drive a multiple scan chain design. However, N input terminals are required to supply the individual scan clock signals SCK1, SCK2 . . . SCKN, and additional input terminals are needed to supply the select signals Sj. The number of input terminals required for a scan based design in accordance with the present invention can be further reduced by utilizing a clock signal generator 36 and/or a select signal generator 38 as shown in FIG. 3 which illustrates another example embodiment of a scan chain architecture in accordance with the present invention which uses four scan chains 100, 102, 104 and 106 (i.e., N=4).

The clock signal generator 36 generates multiple scan clock signals SCK1, SCK2, SCK3 and SCK4 from a single scan clock signal SCK, thereby reducing the number of input terminals. The select signal generator 38 generates the select signals S1 and S2 responsive to the multiple scan clock signals SCK1, SCK2, SCK3 and SCK4 so as to synchronize the scan chain output selected by the multiplexer 32 with the corresponding scan clock signals.

Figure 4:
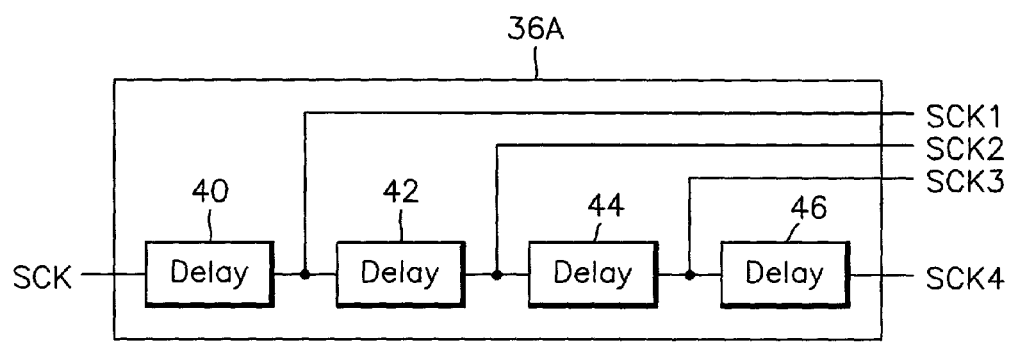
FIG. 4. is a diagram of an example embodiment of a clock signal generator in accordance with the present invention.

One embodiment of a scan clock signal generator in accordance with the present invention is shown in FIG. 4. The generator 36A of FIG. 4 includes a chain of four serially connected delay units 40, 42, 44 and 46. The input of the first delay unit receives a main scan clock signal SCK. The delay units are constructed so that four independent non-overlapping scan clock signals SCK1, SCK2, SCK3 and SCK4 are obtained from the chain of delay units.

Figure 5:
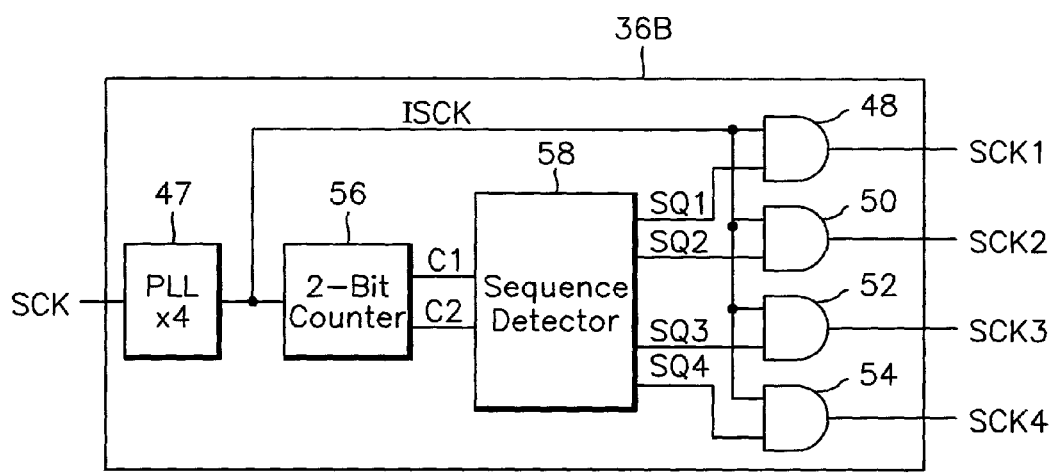
FIG. 5. is a diagram of another example embodiment of a clock signal generator in accordance with the present invention.
Figure 6:
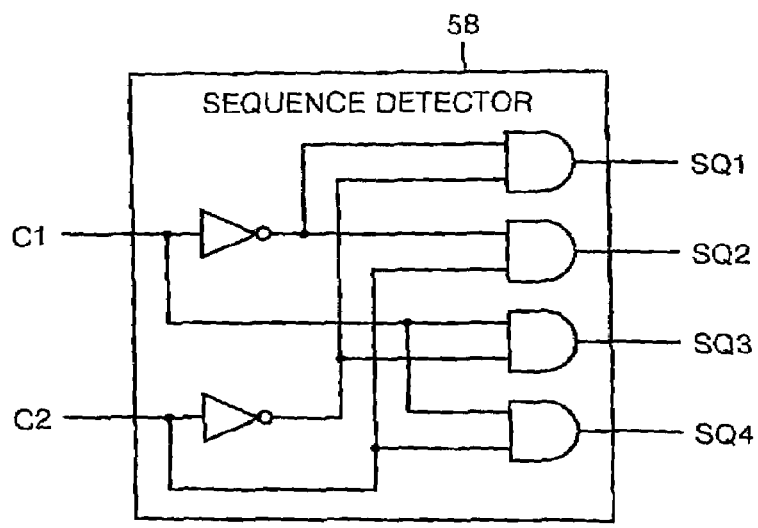
FIG. 6 is a diagram of an example embodiment of a sequence detector in accordance with the present invention for use with the clock signal generator of FIG. 5.

Another embodiment of a scan clock signal generator in accordance with the present invention is shown in FIG. 5. The generator 36B of FIG. 5 includes a phase locked loop 47 which generates an intermediate scan clock signal ISCK at four times the frequency of the scan clock SCK. The ISCK signal is applied to one of the inputs of each of four AND gates 48, 50, 52, 54. The ISCK signal also drives a 2-bit counter 56 which generates count signals COUNT1 and COUNT2, which in turn, drive a sequence detector 58. Each of the four outputs of sequence detector 58 drives the other input of a corresponding one of the AND gates which generate the scan clock signals SCK1, SCK2, SCK3 and SCK4. An example of a sequence detector 58, which is essentially a 1-of-4 decoder, is shown in FIG. 6.

Figure 7:
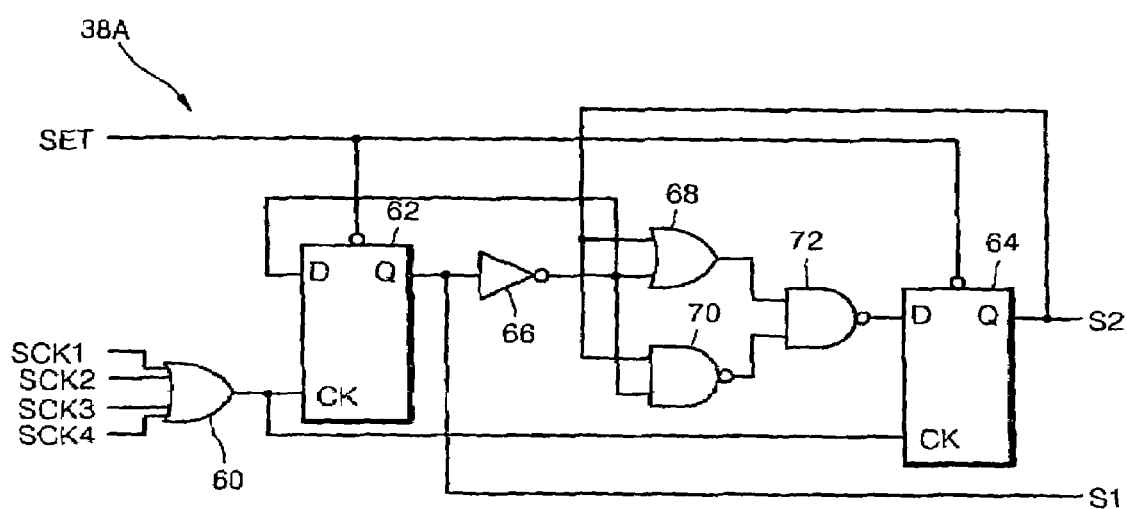
FIG. 7 is a diagram of an example embodiment of a select signal generator in accordance with the present invention.

An embodiment of a select signal generator in accordance with the present invention is shown in FIG. 7. The generator 38A of FIG. 7 includes an OR gate 60 having four inputs which receive the scan clock signals SCK1, SCK2, SCK3 and SCK4, and an output connected to the clock inputs CK of two D flip-flops 62 and 64. The select signals S1 and S2 are taken from the Q outputs of the first and second flip-flops 62 and 64, respectively. The Q output of the first flip-flop 62 is inverted by an inverter 66 and fed back to the D input of flip-flop 62 as well as an input of each of OR gate 68 and NAND gate 70. The Q output of the second flip-flop 64 is fed to the other input of each of OR gate 68 and NAND gate 70. Another NAND gate 72 has its two inputs connected to the outputs of OR gate 68 and NAND gate 70, and its output connected to the D input of flip-flop 64. The reset inputs of flip-flops 62 and 64 are commonly connected to a global reset signal SET in the circuit under test, thereby further reducing the number of input terminals required.

Figures 8, 9:
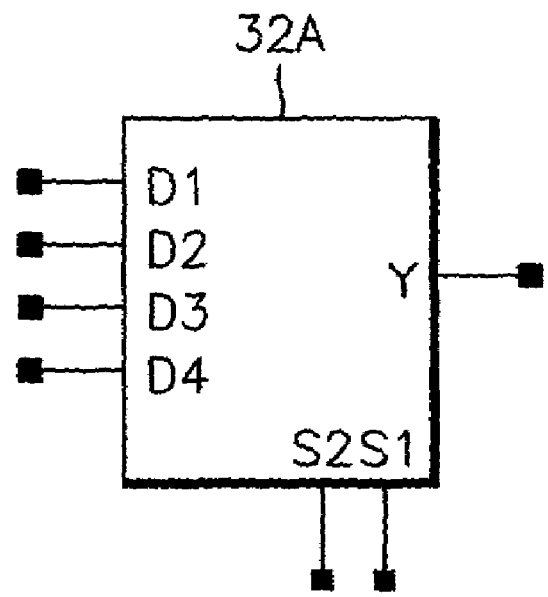
FIG. 8 is a diagram of an embodiment of a multiplexer for use with the scan chain architecture of FIG. 3.
FIG. 9 is a truth table for the multiplexer of FIG. 8.

An example embodiment of a 4-to-1 multiplexer 32A for use with the architecture of FIG. 3 is shown in FIG. 8. A truth table for this multiplexer is shown in FIG. 9.

Figure 10:
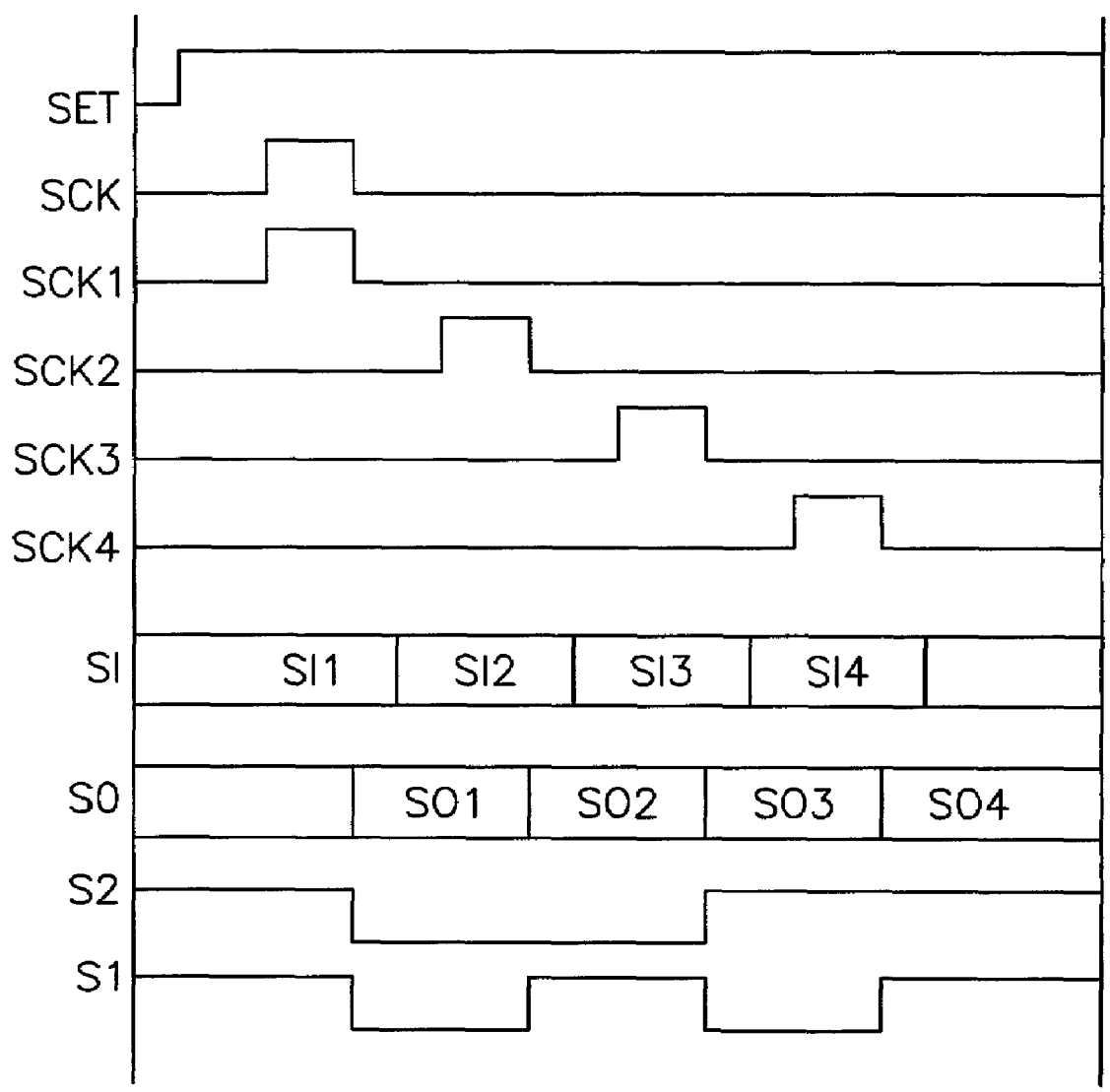
FIG. 10 is a timing diagram that illustrates the operation of the embodiment of FIG. 3.

The overall operation of the embodiment of FIG. 3 will now be described with reference to FIG. 10. First, the scan enable signal SET is activated to place the scan chains in scan mode. Then, the first bit of the scan vector for each scan chain (SI1, SI2, etc.) is sequentially applied to the scan input terminal 30 and clocked into their corresponding scan chains in response to pulses in the individual scan clocks SCK1, SCK2, SCK3 and SCK4 which are generated by the clock signal generator 36 in response to the scan clock signal SCK. After the first bit (SI4) of the scan vector for the fourth scan chain 106 is clocked in, the clock signal generator 36 generates another series of pulses in the individual scan clocks SCK1, SCK2, SCK3 and SCK4, and the second bit for each scan chain is sequentially clocked into its corresponding scan chain. This cycle repeats until all bits of the scan vectors are clocked into their respective scan chains.

As the scan vectors are being clocked into the scan chain, the multiplexer 32 sequentially selects the outputs from the scan chains in response to the select signals S1 and S2 generated by the select signal generator 38 so as to sequentially shift the output data SO1, SO2, SO3 and SO4 out through the output terminal 34.

As with the embodiment of FIG. 1, the embodiment of FIG. 3 can be modified in many ways, and the present invention is not limited by the details of this embodiment. For example, the number of scan chains is not limited to four, and in a practical implementation, N would probably be much higher. Moreover, the present invention is not limited to example embodiments of the clock signal generator and select signal generator shown here.

The clock signal generator 36 and select signal generator 38 each have independent utility, and a practical embodiment can include either of them, both of them, or neither of them. The same is true for the output multiplexer 32. For example, even if the clock signal generator 36 is utilized, the select signals S1 and S2 can still be provided through input terminals, or they can be generated internally with a select signal generator 38.

The multiplexer 32 also has independent utility, and it can reduce the number of pins required for a scan based design, even if multiple scan clocks are not used. Thus, an output multiplexer in accordance with the present invention can be used with multiple scan chains either by itself, or in combination with multiple scan clocks, a clock signal generator, and select signal generator, etc.

Figure 11:
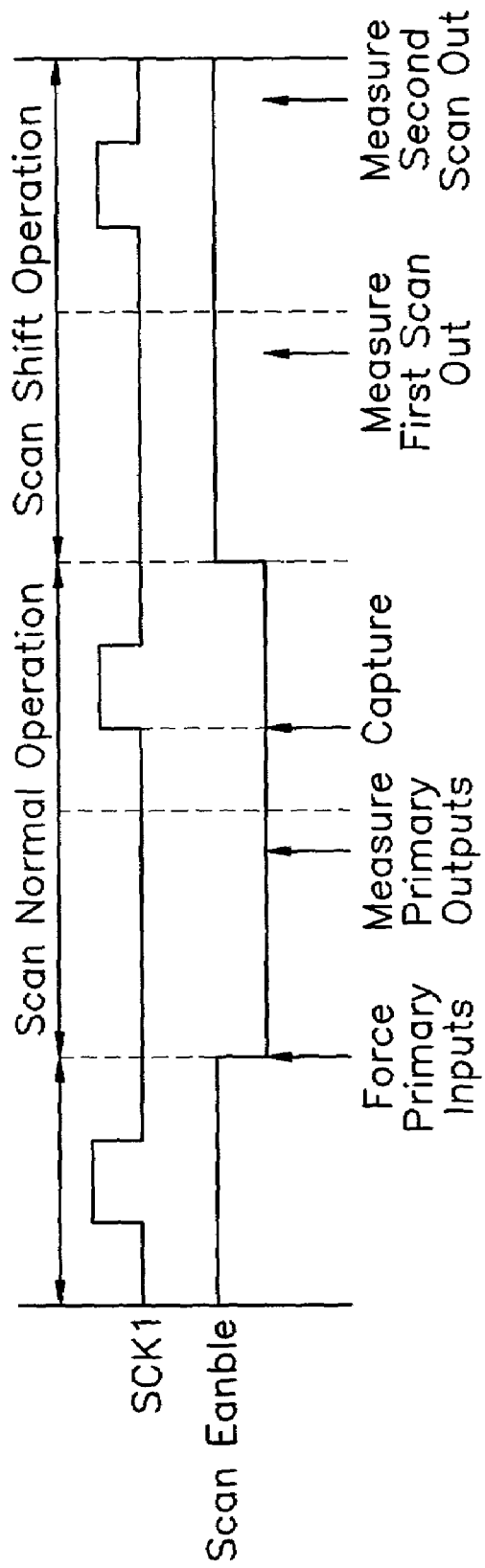
FIG. 11 is a timing diagram illustrating the post-clock monitoring method utilized by a typical ATPG tool.

If a select signal generator in accordance with the present invention is used to control an output multiplexer, there is a possibility that the multiplexer will still be outputting normal operating data when it should preferably be strobing out test data during a scan operation. This can be better understood with reference to FIG. 11 which is a timing diagram illustrating the post-clock monitoring method utilized by a typical ATPG tool. The first scan output value is measured for one clock cycle after a scan normal operation. However, no scan clock is applied during this clock cycle. Therefore, the value captured by the last scan cell in each scan chain during a scan normal operation is not applied to the output terminal. When a scan clock is applied, another shift operation takes place, and the first bit of output test data is lost.

Figure 12:
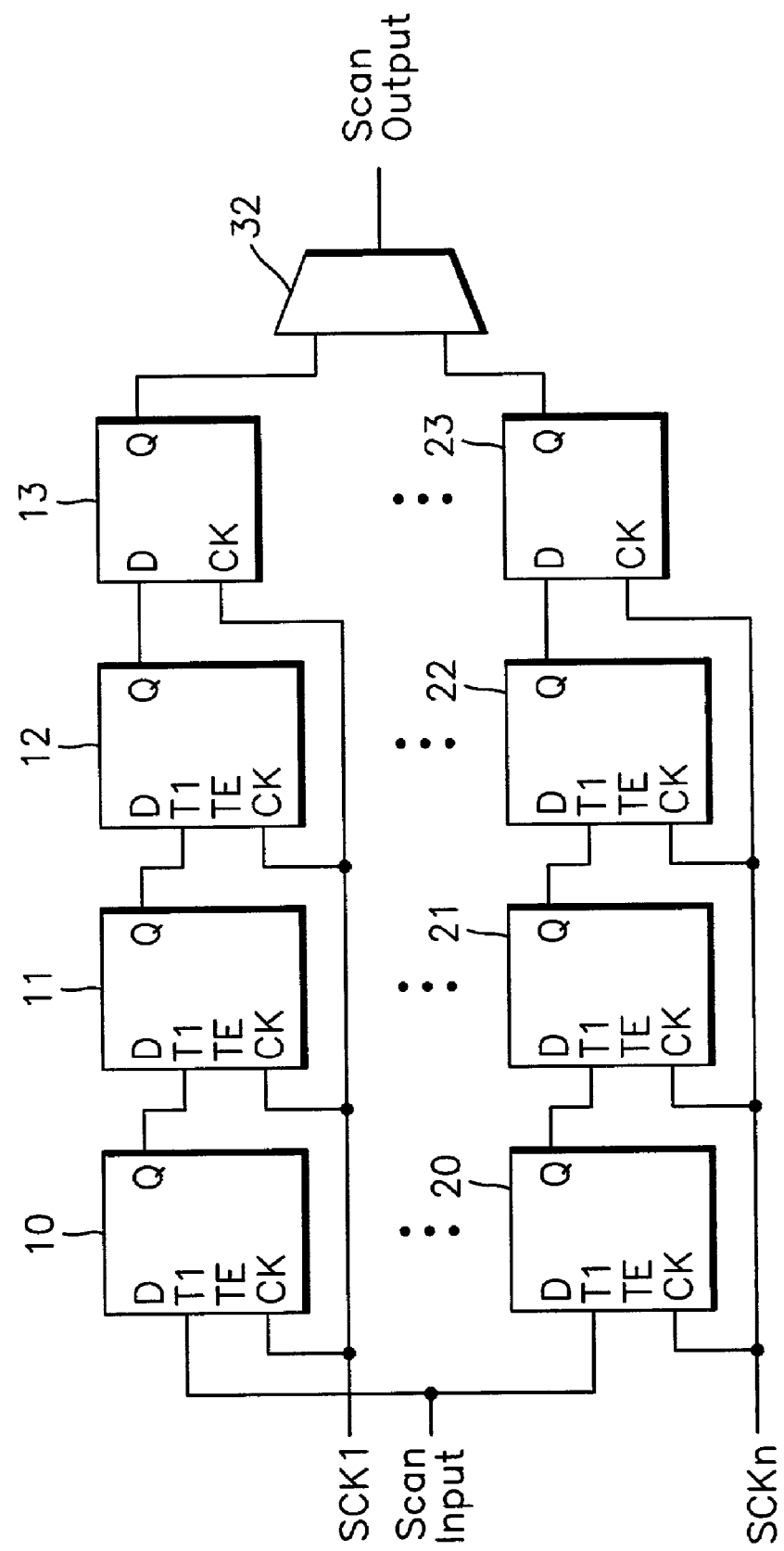
FIG. 12 illustrates an example embodiment of a scan chain architecture having dummy scan cells in accordance with the present invention.

To overcome this problem, the first scan output values captured during normal operation should be held until the next cycle. One possible solution is to insert an extra scan cell ("dummy" scan cell) into each scan chain as shown in FIG. 12. The example circuit of FIG. 12 includes dummy scan cells 13 and 23 at the end of the two scan chains. The first output bit from each scan chain is discarded.

An additional technique for reducing the number of input terminals in a scan based design in accordance with the present invention is to modify the embodiment of FIG. 1 so that two scan chains are driven from each scan clock signal. This can be accomplished, for example, by using negative edge triggered scan flip-flops in one of the chains and positive edge triggered scan flip-flops in the other chain. Then, two of the scan clock inputs shown in FIG. 2, e.g., SCK1 and SCK 2 can be replaced by a single scan clock signal that has a rising edge when the SI1 data is valid and a falling edge when the SI2 data is valid.

Figure 13:
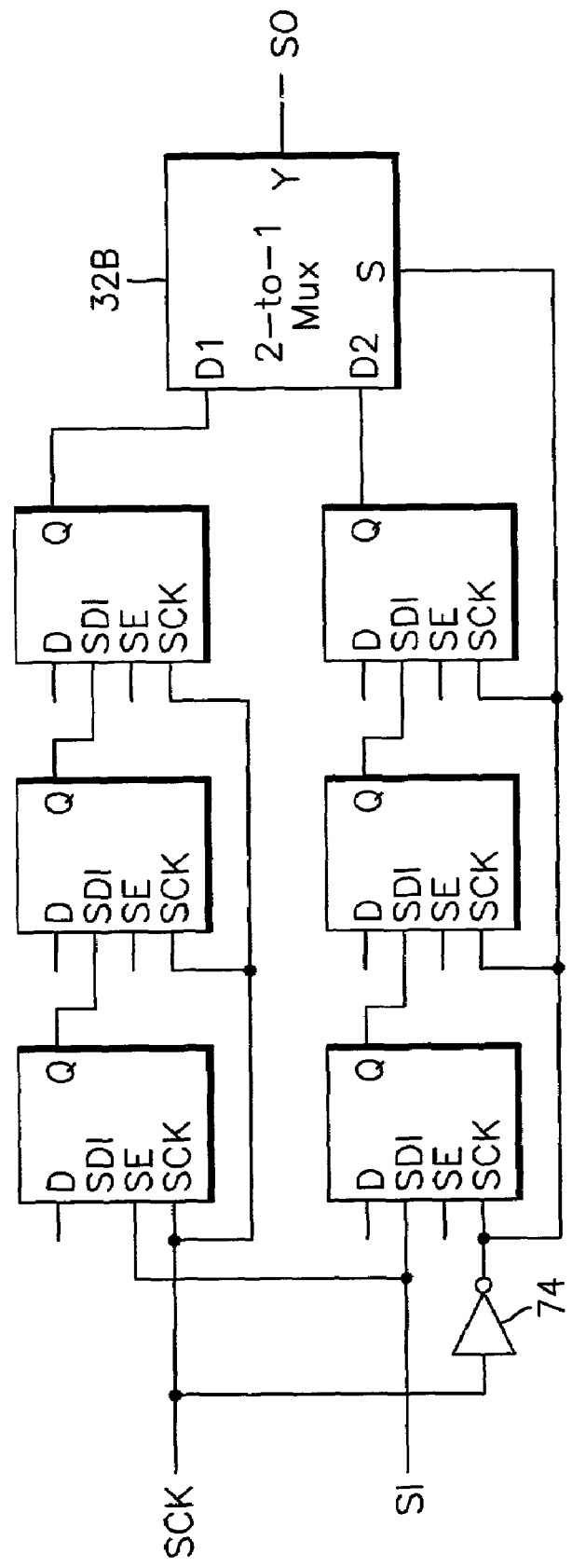
FIG. 13 is a diagram of another embodiment of a scan chain architecture in accordance with the present invention.
Figure 14:
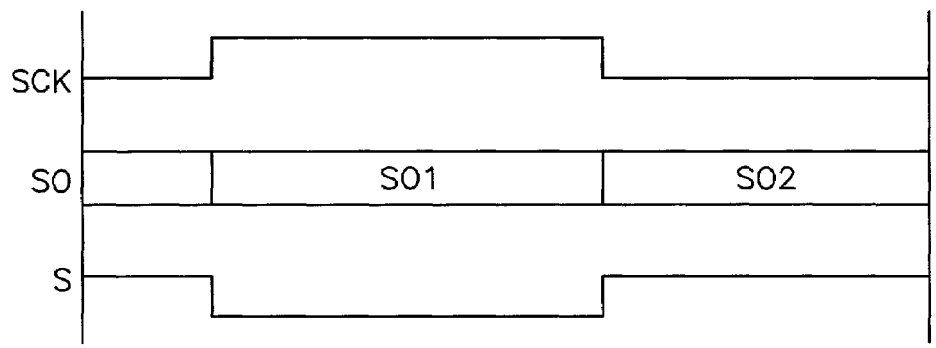
FIG. 14 is a timing diagram that illustrates the operation of the embodiment of FIG. 13.

FIG. 13 is a schematic diagram of yet another embodiment of a scan chain architecture in accordance with the present invention. Because the embodiment of FIG. 13 only includes two scan chains, a single scan clock signal SCK can be used as the first clock signal SCK1 for the first scan chain, and a single inverter 74 can be used to generate both the second clock signal SCK2 for the other scan chain and the select signal S for the 2-to-1 multiplexer 32B. Thus, the scan clock generator and select signal generator are combined into a single circuit element. FIG. 14 is a timing diagram illustrating the operation of the embodiment of FIG. 13. In this case, although more pins are required per scan chain, less support circuitry is needed.

The scan chain architectures made possible by the present invention are particularly well suited for application to testing VLSI semiconductors. If a scan chain circuit in accordance with the present invention is fabricated on an integrated circuit chip, very few of the input/output pads on the chip are required for the input and output terminals of the scan chain circuit. Accordingly, fewer terminal pins or balls are required for test purposes when the chip is mounted in a package.

There are also other advantages to the present invention, some of which have been briefly mentioned above. For example, even though test data is shifted into a single scan input at a higher rate, the frequency of the scan clock signal for each individual scan chain does not increase, so existing scan vectors, which have been produced and verified to operate at certain frequencies, can be used without modification. Thus, there is no increase in overhead associated with other techniques that attempt to increase the frequency of the scan clock signal or recalculate the scan vectors.

An additional advantage of the present invention is that it can be used with conventional automatic test pattern generation (ATPG) tools for generating scan vectors. This can be accomplished by creating a virtual circuit for use with the ATPG tool. The virtual circuit is preferably a conventional scan design circuit with multiple scan chains, each driven by an independent scan clock. The clocks should preferably be asserted with some time intervals, so the proper constraints on clock timing should be used during ATPG. Thus, the clock signal configuration with the up and down transition timing should preferably be described in the test constraints. The clock timing configuration should preferably be compatible with that used in the select signal generator.

After the scan vectors for this virtual circuit are generated, they can be then merged into a single scan vector that can be applied to a single scan input in accordance with the present invention. If a clock signal generator and/or select signal generator in accordance with the present invention are used, only a single clock signal would be defined in the scan vectors while other clock signals would be removed. Otherwise, the select signals that determine the measuring points of the scan output values would be added in the scan vectors.

A further advantage of the present invention is that, since the pulses on individual scan clocks are staggered, the peak power consumed during a scan test operation is reduced as compared with a prior art system in which all scan cells are clocked simultaneously.

Yet another advantage of the present invention is that it can be extended to boundary scan designs that only allow a single scan chain, thus, eliminating the problem of long test vector application time.

As discussed above, the present invention reduces the number of input and output terminals required for a scan based design. With a prior art N-chain scan design, N scan input pins, N scan output pins, one scan enable pin, and one clock pin are required. Thus, a total of 2N+2 test pins are required. In contrast, an N-chain embodiment of the present invention that utilizes an output multiplexer but applies the scan clock and select signals through separate pins requires one scan input pin, one scan output pin, one scan enable pin, N scan clock input pins, and $\lceil Log_2N \rceil$ select signal pins for a total of $N+3+\lceil Log_2N \rceil$ pins. If a scan clock generator in accordance with the present invention is added, only one scan clock input pin is needed, and the total number of test pins required drops to $4+\lceil Log_2N \rceil$. And if a select signal generator is added, the total number of test pins required is four, regardless of how many scan chains are used. Thus, for a scan based design where N=32, a prior art architecture requires 66 pins whereas the present invention requires as little as four.

Experimental data for some example embodiments of the present invention are illustrated below. Experiments were conducted on a digital core having a gate count of 30,000 including 1862 flip-flops. The following three cases were tested:

Case 1: a conventional scan circuit having a single scan chain.

Figure 15:
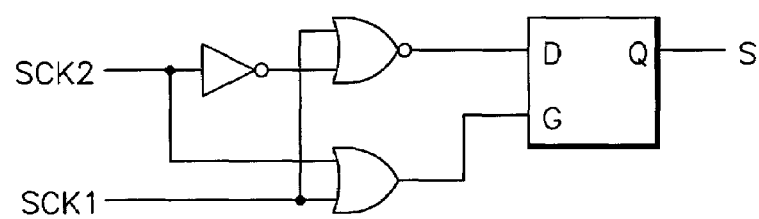
FIG. 15 is a diagram of an embodiment of a select signal generator for a 2-to-1 output multiplexer in accordance with the present invention.

Case 2: a scan circuit having two scan chains in accordance with the present invention. A 2-to-1 multiplexer was used to connect the outputs from the scan chains to a single output pin. The select signal generator of FIG. 15 was used to control the 2-to-1 multiplexer. Dummy shift registers were used each of the scan chains.

Figure 16:
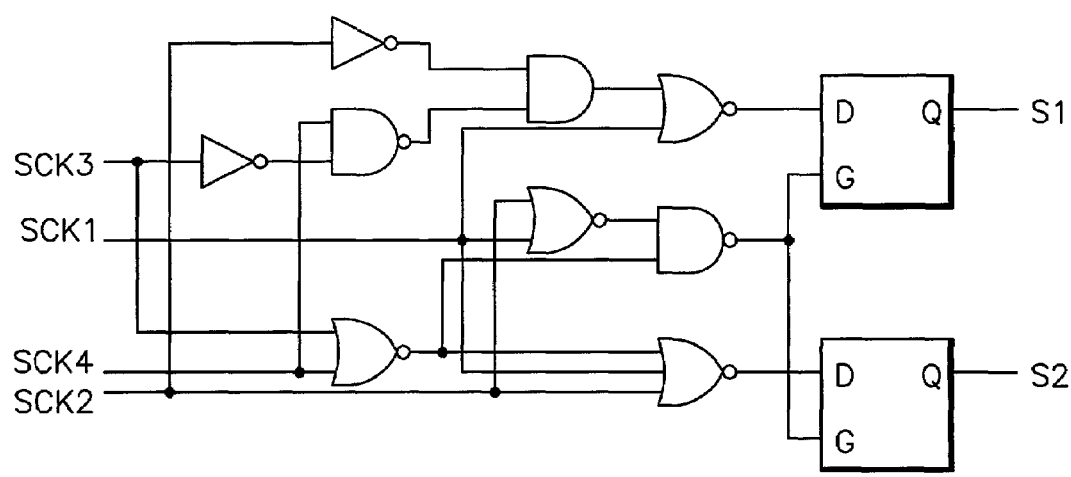
FIG. 16 is a diagram of an embodiment of a select signal generator for a 4-to-1 output multiplexer in accordance with the present invention.

Case 3: a scan circuit having four scan chains in accordance with the present invention. A 4-to-1 multiplexer was used to connect the outputs from the scan chains to a single output pin. The select signal generator of FIG. 16 was used to control the 4-to-1 multiplexer. Dummy shift registers were used each of the scan chains.

In cases 2 and 3, the scan inputs were shared with an input pin by merging the input signals. Individual scan clock signals were used, i.e., no clock signal generator was not used.

Using a scan synthesis tool, a scan circuit for case 1 and a virtual circuit for each of cases 2 and 3 were generated. Then, scan vectors were generated for each circuit using an ATPG tool. Conditional timing constraints for multiple scan chains with multiple scan clocks were used for cases 2 and 3 during ATPG. The scan vectors for cases 2 and 3 were merged to form single scan vectors.

In all three cases, logic simulations were performed using the scan vectors to validate the merged scan vectors and to compare the test application time. Fault simulation was also performed to examine the fault coverage for each case. Finally, power estimation was performed to estimate the maximum current for each case.

The table in FIG. 17 shows the logic simulation times for all three cases. The logic simulation time listed in the first row is the test application time. FIG. 17 shows that the test application time for cases 2 and 3 are less than half and a quarter, respectively, of that in case 1. The CPU time for logic simulation show similar reductions in actual execution time.

The table of FIG. 18 shows the fault simulation statistics for all three cases. Detected faults are shown as Drop_detected and Drop_potential. Although the total number of faults is slightly different due to circuit differences, the fault coverage for all three cases is almost the same.

Finally, the table of FIG. 19 shows the peak power consumption for all three cases using periodic average power estimation. For comparison purposes, power consumption for the virtual circuits used to generate the scan vectors are shown. As illustrated by FIG. 19, the peak power consumption decreases significantly as the number of scan chains in accordance with the present invention increases.

Figure 20:
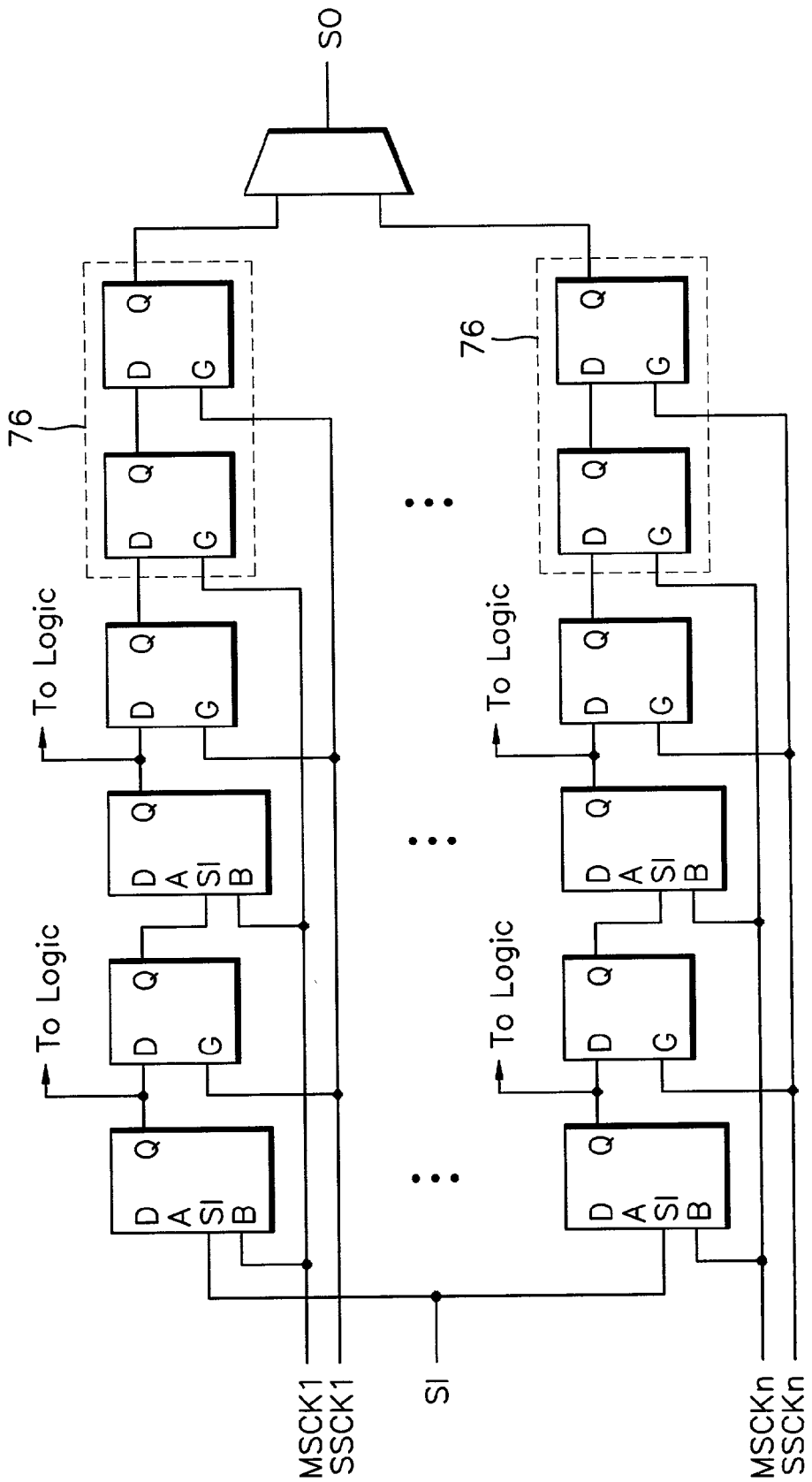
FIG. 20 is a diagram that illustrates how level sensitive scan design (LSSD) scan cells can be used in accordance with the present invention.

Having described and illustrated the principles of the invention in a preferred embodiment thereof, it should be apparent that the invention can be modified in arrangement and detail without departing from such principles. For example, the embodiments described above are shown with multiplexed scan cells, but other types of scan cells such as level sensitive scan design (LSSD) cells or Clocked-Scan cells can be used. To this end, FIG. 20 illustrates how the present invention can be implemented with LSSD scan cells, in which case each scan cell includes inputs for both master clock signals SCKM and slave clock signals SCKS. The circuit of FIG. 20 includes the optional dummy cells 76 which prevent problems with lost data as discussed above with reference to FIGS. 11 and 12. Master clock signals are designated MSCK, while slave clock signals are designated SSCK. Accordingly, such changes and modifications are considered to fall within the scope of the following claims.

The invention claimed is:

1. A circuit comprising a plurality of scan chains having a plurality of scan inputs coupled to an input terminal, and a plurality of scan clock inputs coupled to receive a plurality of scan clock signals, wherein at least two of the scan inputs are connected together at a single input terminal, and wherein data for more than one of the scan chains are sequentially applied to the single input terminal and clocked by corresponding ones of the scan clock signals so that data for a first one of the scan chains is interleaved with data for at least a second one of the scan chains.

2. A circuit according to claim 1 further comprising a scan clock signal generator coupled to the plurality of scan chains and adapted to generate the plurality of scan clock signals responsive to a single scan clock signal.

3. A circuit according to claim 2 wherein the plurality of scan clock signals have non-overlapping active edges/levels.

4. A circuit according to claim 2 wherein the scan clock signal generator comprises a delay chain.

5. A circuit according to claim 2 wherein the scan clock signal generator comprises:
   a phase-locked loop;
   a counter coupled to the phase-locked loop; and
   a sequence detector coupled to the counter.

6. A circuit according to claim 1 further comprising a multiplexer arranged to couple a plurality of scan outputs of the scan chains to an output terminal responsive to one or more select signals.

7. A circuit according to claim 6 wherein the circuit is an integrated circuit, and the input and output terminals are pads.

8. A circuit according to claim 6 wherein the circuit is an integrated circuit mounted in a package, and the input and output terminals are pins.

9. A circuit according to claim 1 wherein each of the scan chains comprises a plurality of multiplexed scan elements.

10. A circuit according to claim 1 wherein each of the scan chains comprises a plurality of clocked scan elements.

11. A circuit according to claim 1 wherein:
   each of the scan chains comprises a plurality of level sensitive scan design elements;
   the plurality of scan clock inputs are master scan clock inputs;
   the plurality of scan clock signals are master scan clock signals; and
   the plurality of scan chains have a plurality of slave clock inputs coupled to receive a plurality of slave scan clock signals.

12. A circuit comprising a plurality of scan chains having a plurality of scan outputs coupled to an output terminal through a multiplexer, wherein the multiplexer output is transmitted to the output terminal without passing through a partitioning scan chain, and wherein the plurality of scan chains have a plurality of scan inputs coupled to a single input terminal, and a plurality of scan clock inputs coupled to receive a plurality of scan clock signals, and wherein the circuit is arranged so that data for more than one of the scan chains is sequentially applied to the single input terminal and clocked by corresponding ones of the scan clock signals so that data for a first one of the scan chains is interleaved with data for at least a second one of the scan chains.

13. A circuit according to claim 12 further comprising a scan clock signal generator coupled to the plurality of scan chains, and adapted to generate the plurality of scan clock signals responsive to a single scan clock signal.

14. A circuit according to claim 13 wherein the plurality of scan clock signals have non-overlapping active edges/levels.

15. A circuit according to claim 13 wherein the scan clock signal generator comprises a delay chain.

16. A circuit according to claim 13 wherein the scan clock signal generator comprises:
   a phase-locked loop;
   a counter coupled to the phase-locked loop; and
   a sequence detector coupled to the counter.

17. A circuit according to claim 12 wherein the circuit is an integrated circuit, and the input and output terminals are pads.

18. A circuit according to claim 12 wherein the circuit is an integrated circuit mounted in a package, and the input and output terminals are pins.

19. A circuit according to claim 12 wherein each of the scan chains comprises a plurality of multiplexed scan elements.

20. A circuit according to claim 12 wherein each of the scan chains comprises a plurality of clocked scan elements.

21. A circuit comprising a plurality of scan chains having a plurality of scan outputs coupled to an output terminal through a multiplexer, wherein the multiplexer output is transmitted to the output terminal without passing through a partitioning scan chain, and wherein:
   each of the scan chains comprises a plurality of level sensitive scan design elements;
   the plurality of scan clock inputs are master scan clock inputs;
   the plurality of scan clock signals are master scan clock signals; and
   the plurality of scan chains have a plurality of slave clock inputs coupled to receive a plurality of slave scan clock signals.

22. A method for testing a circuit comprising a plurality of scan chains having a plurality of scan inputs and a plurality of scan outputs, the method comprising:
   driving the plurality of scan inputs through an input terminal, wherein at least two of the scan inputs receive the same scan input signal; and
   clocking the plurality of scan chains with a plurality of scan clock signals;
   wherein data for more than one of the scan chains are sequentially applied to the single input terminal and clock by corresponding ones of the scan clock signals so that data for a first one of the scan chains is interleaved with data for at least a second one of the scan chains.

23. A method according to claim 22 further comprising shifting out data from the plurality of scan outputs through an output terminal.

24. A method according to claim 23 wherein shifting out data from the plurality of scan outputs through an output terminal comprises:
   sequentially selecting one of the plurality of scan outputs; and
   shifting out data from the selected scan output through the output terminal.

25. A method according to claim 22 further comprising generating the plurality of scan clock signals having non-overlapping active edges/levels.

26. A method according to claim 22 wherein the circuit is an integrated circuit, and the input and output terminals are pads.

27. A method according to claim 22 wherein the circuit is an integrated circuit mounted in a package, and the input and output terminals are pins.

28. A method according to claim 22 wherein:
   clocking the plurality of scan chains with a plurality of scan clock signals comprises clocking the plurality of scan chains with a plurality of master scan clock signals and a plurality of slave scan clock signals.

29. A method for testing a circuit comprising a plurality of scan chains having a plurality of scan inputs and a plurality of scan outputs, the method comprising:

driving the plurality of scan inputs through an input terminal, wherein at least two of the scan inputs receive the same scan input signal, and data for more than one of the scan chains are sequentially applied to the input terminal;

clocking the plurality of scan chains with corresponding ones of a plurality of scan clock signals, so that data for a first one of the scan chains is interleaved with data for at least a second one of the scan chains; and shifting out data from the plurality of scan outputs through a multiplexer to an output terminal.

30. A method according to claim 29 wherein shifting out data from the plurality of scan outputs through an output terminal comprises:

sequentially selecting one of the plurality of scan outputs; and shifting out data from the selected scan output through the output terminal.

31. A method according to claim 29 further comprising:

driving the plurality of scan inputs through an input terminal; and clocking the plurality of scan chains with a plurality of scan clock signals.

32. A method according to claim 31 further comprising generating the plurality of scan clock signals having non-overlapping active edges/levels.

33. A method according to claim 31 wherein the circuit is an integrated circuit, and the input and output terminals are pads.

34. A method according to claim 31 wherein the circuit is an integrated circuit, and the input and output terminals are pins.

35. A method according to claim 31 wherein clocking the plurality of scan chains with a plurality of scan clock signals comprises clocking the plurality of scan chains with a plurality of master scan clock signals and a plurality of slave scan clock signals.

36. A method for loading scan vectors into a circuit comprising a plurality of scan chains having a plurality of scan inputs and a plurality of scan outputs, the method comprising:

broadcasting a plurality of scan vectors to the plurality of scan chains wherein bits from more than one of the scan vectors are interleaved; and selectively clocking only the bits of a first one of the scan vectors into a first one of the scan chains.

37. A method according to claim 36 further comprising clocking bits fron the plurality of scan vectors into their corresponding scan chains using a plurality of scan clock signals.

* * * * *

UNITED STATES PATENT AND TRADEMARK OFFICE
CERTIFICATE OF CORRECTION

PATENT NO. : 7,249,298 B2  Page 1 of 1
APPLICATION NO. : 10/136670
DATED : July 24, 2007
INVENTOR(S) : Gyoochan Sim It is certified that error appears in the above-identified patent and that said Letters Patent is hereby corrected as shown below:

Column 12, line 22, the word "fron" should read -- from --.

Signed and Sealed this

Second Day of September, 2008

JON W. DUDAS
*Director of the United States Patent and Trademark Office*